(12) United States Patent
Ooi et al.

(10) Patent No.: US 8,513,537 B2
(45) Date of Patent: Aug. 20, 2013

(54) PRINTED BOARD AND METHOD OF MANUFACTURING PRINTED BOARD

(75) Inventors: Takahiro Ooi, Kawasaki (JP); Tetsuro Yamada, Kawasaki (JP); Yoshihiro Morita, Kawasaki (JP); Akiko Matsui, Kawasaki (JP); Mitsuhiko Sugane, Kawasaki (JP); Takahide Mukouyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 184 days.

(21) Appl. No.: 12/859,829

(22) Filed: Aug. 20, 2010

(65) Prior Publication Data

US 2011/0073354 A1    Mar. 31, 2011

(30) Foreign Application Priority Data

Sep. 30, 2009  (JP) .................................. 2009-226189

(51) Int. Cl.
*H05K 1/11* (2006.01)
(52) U.S. Cl.
USPC .............................. 174/261; 174/250; 361/748
(58) Field of Classification Search
USPC ........... 174/68.1, 96, 352, 393, 394, 250–262
See application file for complete search history.

(56) References Cited

U.S. PATENT DOCUMENTS

| | | | | |
|---|---|---|---|---|
| 6,496,377 B1 * | 12/2002 | Happ et al. | ..................... | 361/739 |
| 6,657,130 B2 * | 12/2003 | Van Dyke et al. | ............ | 174/255 |
| 6,835,889 B2 * | 12/2004 | Hiraoka et al. | ............... | 174/521 |
| 7,738,261 B2 * | 6/2010 | Sekiya | ........................... | 361/812 |
| 7,919,716 B2 * | 4/2011 | Muro et al. | .................... | 174/261 |
| 2006/0120059 A1 | 6/2006 | Farkas et al. | | |
| 2007/0110388 A1 | 5/2007 | Alger et al. | | |
| 2007/0178289 A1 | 8/2007 | Cases et al. | | |
| 2007/0182436 A1 | 8/2007 | Freda et al. | | |
| 2008/0186687 A1 | 8/2008 | Lin et al. | | |
| 2008/0227312 A1 * | 9/2008 | Ogata et al. | ..................... | 439/75 |

FOREIGN PATENT DOCUMENTS

| | | |
|---|---|---|
| CN | 101242707 A | 8/2008 |
| JP | 5-15467 | 2/1993 |
| JP | 2004-152874 A | 5/2004 |
| JP | 2008-193073 | 8/2008 |

OTHER PUBLICATIONS

European Search Report application No. 10174430.8 dated Jan. 31, 2011.
First Office Action dated Jun. 25, 2012 corresponding to Chinese Patent Application No. 201010297991.6 and English translation thereof.
Office Action dated Jan. 31, 2013 for corresponding Taiwanese Patent Application No. 099127967 with partial English language translation.

* cited by examiner

*Primary Examiner* — Courtney Smith
(74) *Attorney, Agent, or Firm* — Squire Sanders (US) LLP

(57) ABSTRACT

A printed board includes an insulating body that has a flat surface and includes insulating cloth including first fibers and second fibers that cross the first fibers at right angles on the flat surface, and printed wiring including a plurality of signal lines that run parallel to each other and are laid out on the flat surface of the insulating body so that a direction of the signal lines is tilted to a direction of the first or second fibers at an angle which is determined based on board-cutting efficiency of the insulating body and a predetermined delay-time difference between the signal lines.

6 Claims, 5 Drawing Sheets

FIG. 5
| TILT ANGLE | 0° | ... | 8° | 9° | 10° | ... | 30° |
|---|---|---|---|---|---|---|---|
| DELAY-TIME DIFFERENCE | 74.5ps | ... | 32.8ps | 17.5ps | 30.6ps | ... | 17.9ps |
FIG. 6
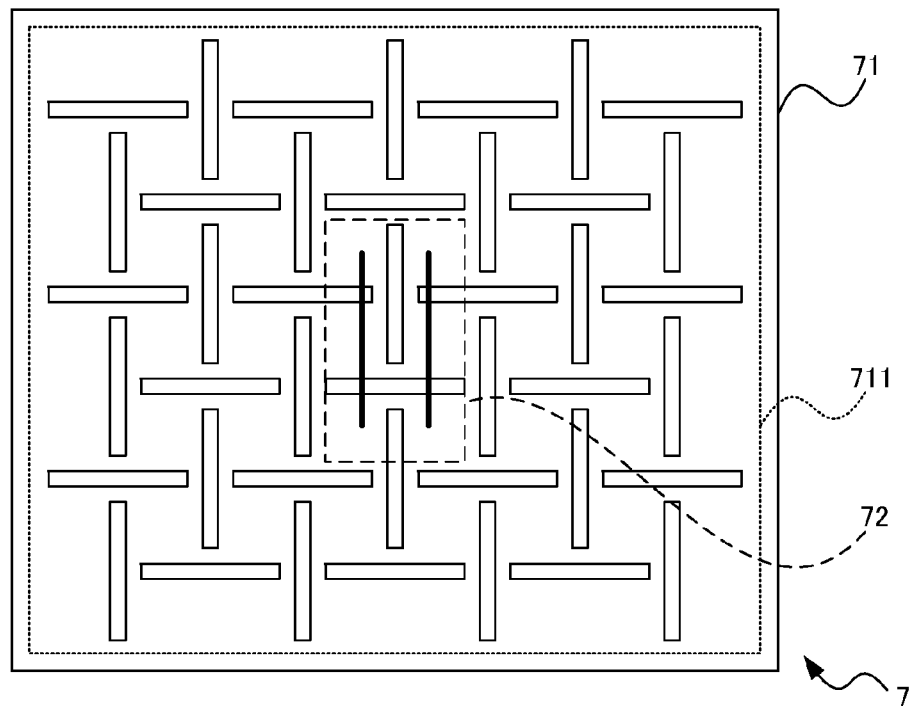
FIG. 7
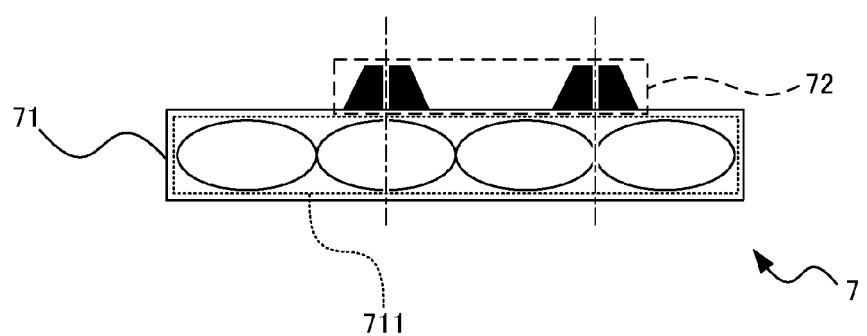

REQUIRED SIZE

PRINTED BOARD AND METHOD OF MANUFACTURING PRINTED BOARD

CROSS-REFERENCE TO RELATED APPLICATIONS

This application is based upon and claims the benefit of priority of the prior Japanese Patent Application No. 2009-226189, filed on Sep. 30, 2009, the entire contents of which are incorporated herein by reference.

FIELD

The technique disclosed herein relates to a printed board and a method of manufacturing the printed board.

BACKGROUND

The frequency for high-speed transmission on a printed board is about to reach a range of 3 to 5 GHz. Differences in the delay time of signals therefore occur between signal lines on a printed board where a plurality of signal lines are laid out on an insulating body in which insulating cloth is disposed. The following describes the differences of delay time. FIG. 6 is a diagram illustrating a printed board made of an insulating material where glass cloth is disposed. FIG. 7 is a diagram illustrating concave and convex portions of glass cloth and signal lines. As illustrated in FIG. 6, a printed board 7 includes an insulating body 71 that is glass cloth 711, which serves as insulating cloth, impregnated with resin; and printed wiring 72 including a plurality of signal lines that run parallel to each other. The glass cloth 711 is woven from glass fibers that cross each other at right angles. As illustrated in FIG. 7, on the printed board 7, a plurality of signal lines in the printed wiring 72 are located differently relative to the concave and convex portions of the glass fibers depending on where the signal lines are disposed. Much of the printed wiring 72 is parallel or at right angles to the glass fibers, in which case the position of each signal line in the printed wiring 72 relative to the concave and convex portions of the glass fibers is always constant. Since there is a difference in permittivity between the glass fibers and the resin, the distance from the glass fibers causes the differences in the delay time of signals between the signal lines.

A technique of laying out signal lines in a zigzag pattern is known to dissolve the differences of delay time. FIG. 8 is a diagram illustrating signal lines laid out in a zigzag pattern. As illustrated in FIG. 8, on a printed board 8, printed wiring 82 is laid out in a zigzag pattern so as not to be parallel or at right angles to the glass fibers of the insulating body 71. Thus, the distances between each of a plurality of signal lines in the printed wiring 82 and the glass fibers are never fixed. Therefore, it is possible to reduce the differences in the delay time of signals between the signal lines. However, the zigzag pattern makes the lines longer than the normal way of wiring, making it impossible to propagate high-speed signals in a stable manner in the range of 5 to 10 GHz. Moreover, the zigzag pattern leads to deterioration of signal waveforms, reductions in the density of wiring, increasing transmission loss and the like due to the longer lines.

A technique of providing the printed wiring tilted at 45 degrees to an insulating body is known to solve the above problem. FIG. 9 is a diagram illustrating a printed board whose printed wiring is tilted at 45 degrees to an insulating body. As illustrated in FIG. 9, on a printed board 9, printed wiring 91 as a whole is tilted at 45 degrees to the insulating body 71 in order to obtain the same effect as the zigzag pattern does without changing the routes of a plurality of signal lines 911. Therefore, the differences of delay time between the signal lines 911 decrease without leading to deterioration of signal waveforms, reductions in the density of wiring, increased transmission losses and the like.

Patent Document 1: Japanese Laid-open Patent Publication No. 2008-193073
Patent Document 2: Japanese Laid-open UM Publication No. 05-15467

However, as illustrated in FIG. 9, the 45-degree tilting of the printed wiring 91 on the insulating body 71 requires a larger insulating body 71 compared with the one that is not tilted, resulting in a significant decrease in the efficiency of cutting the board.

SUMMARY

According to an aspect of the invention, a printed board includes: an insulating body that has a flat surface and includes insulating cloth including first fibers and second fibers that cross the first fibers at right angles on the flat surface; and printed wiring including a plurality of signal lines that run parallel to each other and are laid out on the flat surface of the insulating body so that a direction of the signal lines is tilted to a direction of the first or second fibers at an angle which is determined based on board-cutting efficiency of the insulating body and a predetermined delay-time difference between the signal lines.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a diagram illustrating the tilt angle of the printed wiring and delay-time difference;

FIG. 6 is a diagram illustrating a printed board made of an insulating material where glass cloth is disposed;

FIG. 7 is a diagram illustrating concave and convex portions of glass cloth and signal lines;

DESCRIPTION OF EMBODIMENT(S)

Hereinafter, an embodiment of the present invention will be described with reference to the accompanying drawings.

Figure 1:
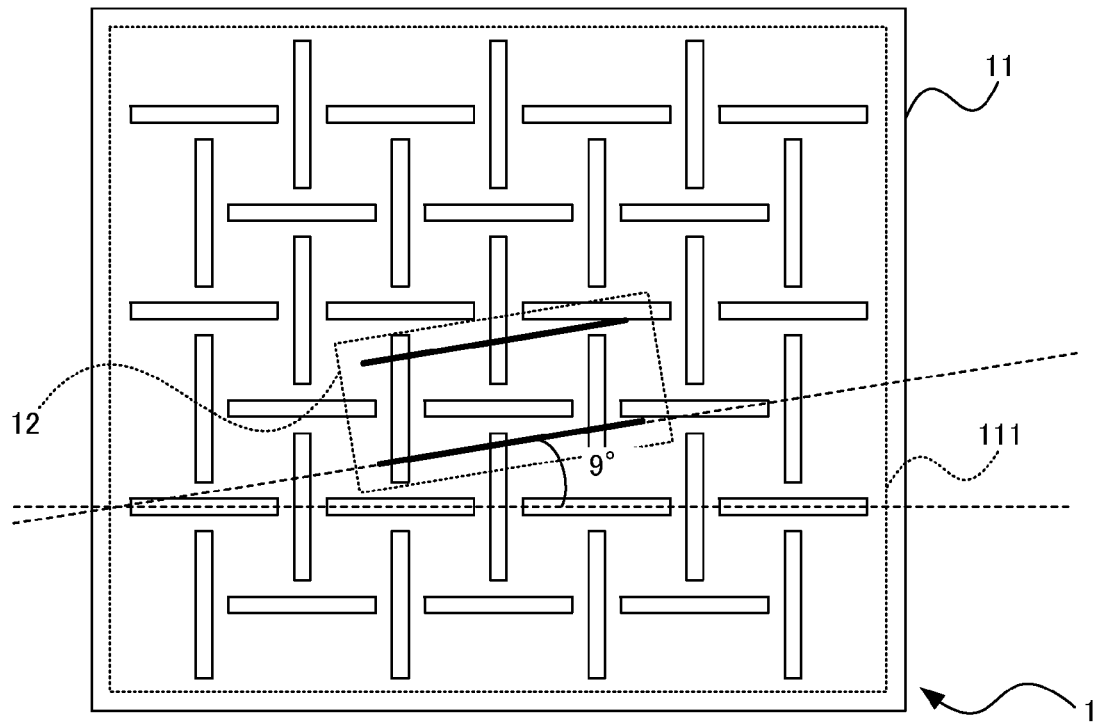
FIG. 1 is a diagram illustrating the configuration of a printed board according to an embodiment of the present invention.
Figure 2:
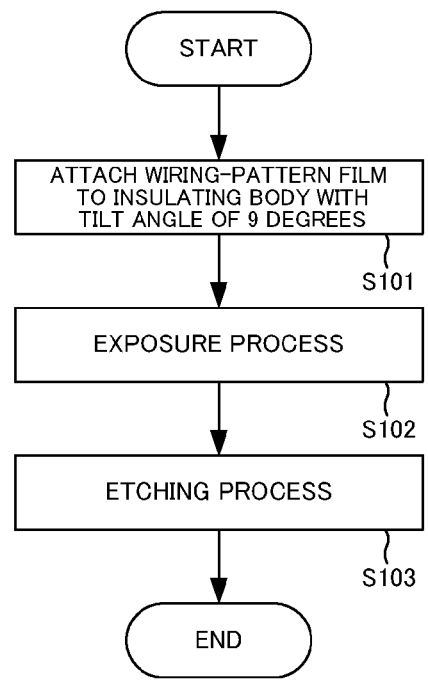
FIG. 2 is a diagram illustrating a method of manufacturing the printed board according to an embodiment of the present invention.

Described first is a printed board of the present embodiment. FIG. 1 is a diagram illustrating the configuration of a printed board according to the present embodiment. FIG. 2 is a diagram illustrating a method of manufacturing the printed board according to the present embodiment.

As illustrated in FIG. 1, a printed board 1 of the present embodiment includes an insulating body 11 that forms a flat surface; and printed wiring 12 that is laid out on the flat surface of the insulating body 11. Inside the insulating body 11, glass cloth 111 is disposed. The glass cloth 111 is insulating cloth woven from the vertical glass fibers (first fibers) and horizontal glass fibers (second fibers) that cross each other at right angles on the flat surface of the insulating body 11. As for the distance between the glass fibers running in the same direction on the glass cloth 111, the vertical fibers have a distance of 420 μm and the horizontal fibers have a distance of 440 μm according to the present embodiment. The printed wiring 12 also has a plurality of signal lines that includes the signal lines laid out parallel to each other at least. If a plurality of the signal lines includes the signal lines laid out in a different direction, the wiring direction of a plurality of the signal lines is assumed to be the direction of the longest signal line laid out among a plurality of the signal lines. The printed wiring 12 is laid out on the flat surface of the insulating body 11 in such a way that the wiring direction is tilted at 9 degrees to the direction of the glass fibers.

Figure 3:
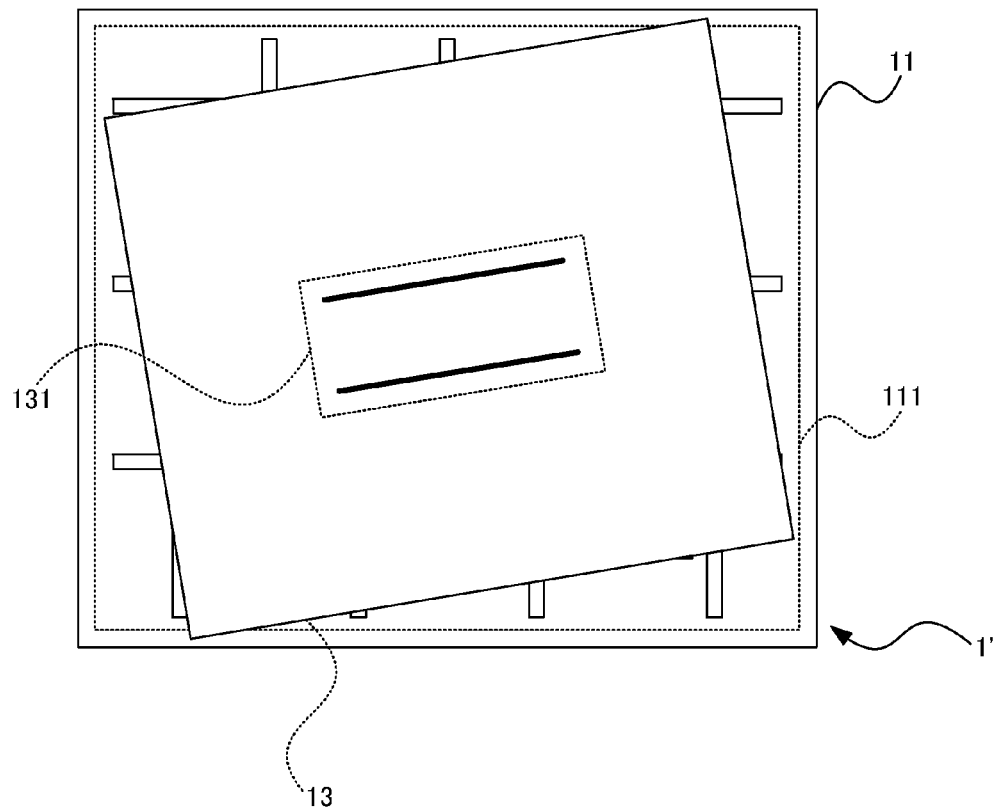
FIG. 3 is a diagram illustrating a film on which a wiring pattern is formed.

The following describes a method of manufacturing a printed board according to the present embodiment. FIG. 2 is a diagram illustrating a method of manufacturing the printed board according to the present embodiment. FIG. 3 is a diagram illustrating a film on which a wiring pattern is formed.

As illustrated in FIG. 2, in a process of manufacturing the printed board 1, a film 13 on which a wiring pattern 131 is formed as illustrated in FIG. 3 is attached to the insulating body 11 in a such a way that the film 13 is tilted at 9 degrees to the glass fibers (S101). An exposure process is then performed for the insulating body 11 to which the film 13 is attached (S102). After the exposure process, unnecessary conductors are removed by etching process and the wiring pattern 12 is formed on the insulating body 11 as a result (S103). After the formation of the wiring pattern 12, the insulating body 11 is cut into pieces that fit the size of the commercial version of the printed board 1.

Figure 4:
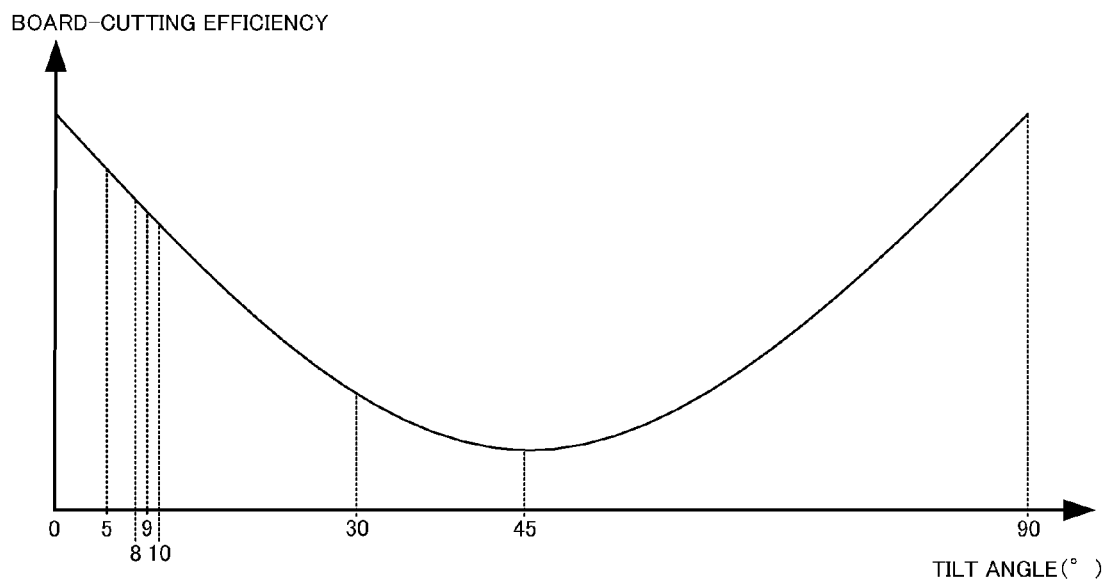
FIG. 4 is a diagram illustrating a correlation between board-cutting efficiency and tilt angle of printed wiring.
Figure 8:
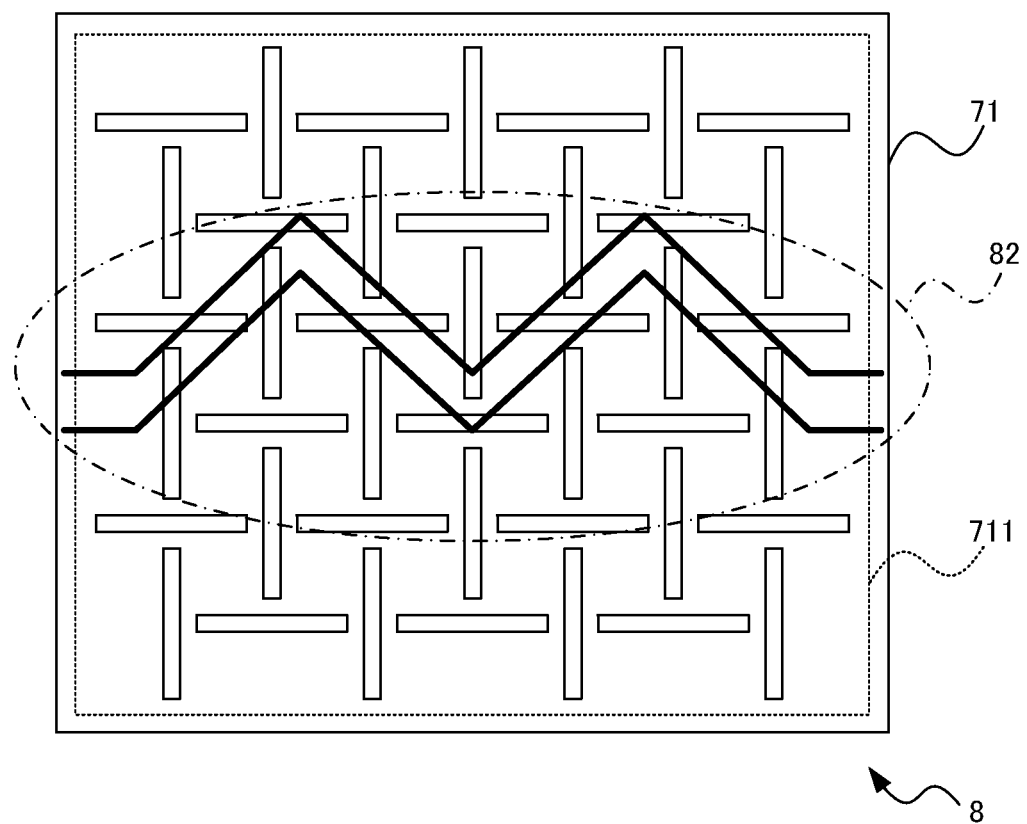
FIG. 8 is a diagram illustrating signal lines laid out in a zigzag pattern.
Figure 9:
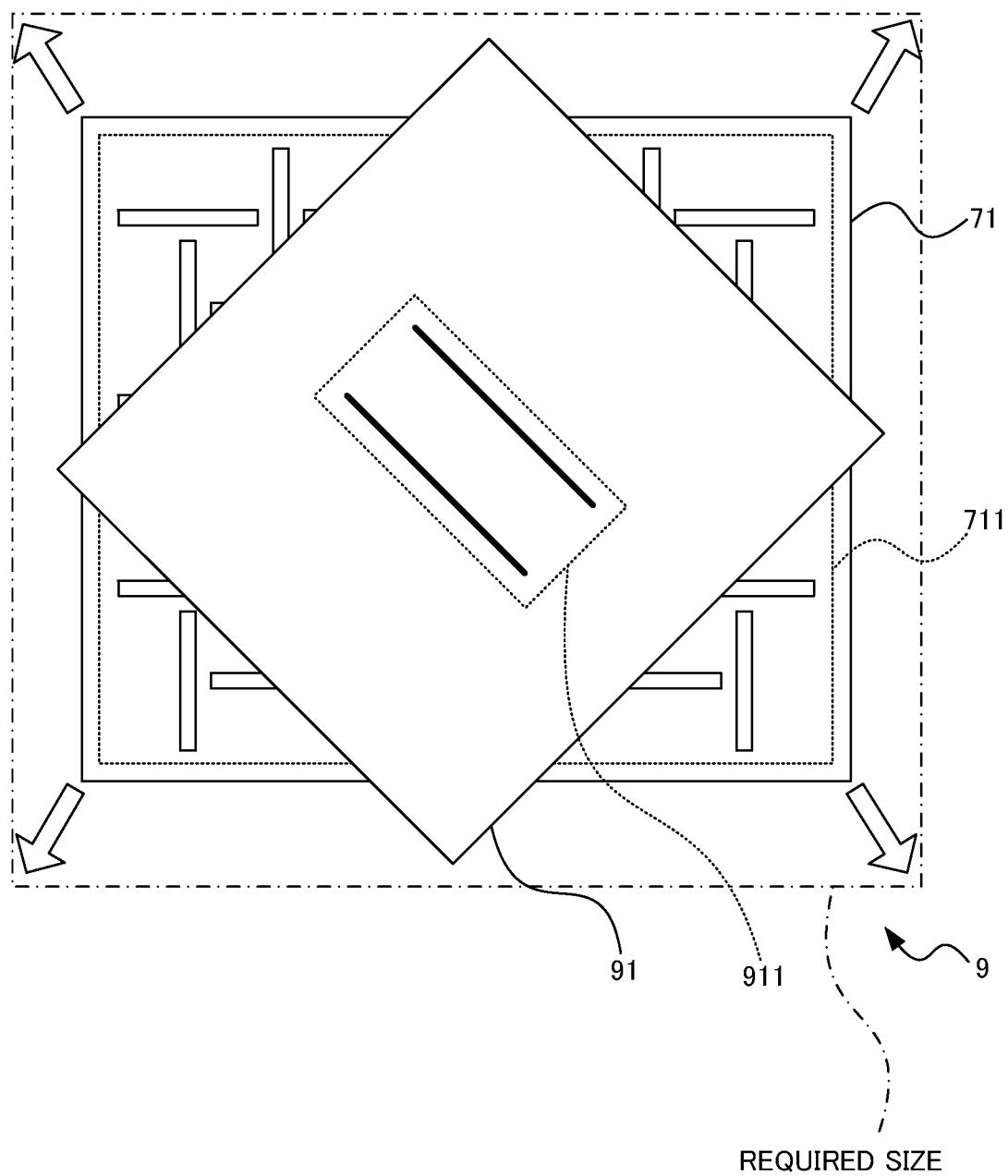
FIG. 9 is a diagram illustrating a printed board whose printed wiring is tilted at 45 degrees to an insulating body.

The following describes a correlation between the board-cutting efficiency and the tilt angle of the printed wiring as well as the tilt angle and the delay-time difference. FIG. 4 is a diagram illustrating a correlation between the board-cutting efficiency and the tilt angle of the printed wiring. In FIG. 4, the vertical axis represents the board-cutting efficiency, while the horizontal axis represents the tilt angle of the printed wiring. FIG. 5 is a diagram illustrating the tilt angle of the printed wiring and the delay-time difference.

As illustrated in FIG. 4, the board-cutting efficiency peaks at 0 degree and has the lowest value at 45 degrees, meaning that in the range of 0 to 45 degrees, the board-cutting efficiency increases as the tilt angle decreases. As illustrated in FIG. 5, when the delay-time difference between the signal lines is measured at each tilt angle, the delay-time difference comes to 17.5 ps (picosecond) at 9 degrees. In general, it is preferable that the delay-time difference between signal lines be less than or equal to 20 ps. According to the present embodiment, the tilt angle of the printed wiring 12 is 9 degrees, the smallest of all the tilt angles for which the delay-time difference is less than or equal to 20 ps. That is, according to the present embodiment, what is formed on the insulating body 11 of the printed board 1 is the printed wiring 12 whose tilt angle relative to the glass fibers is based on the board-cutting efficiency of the insulating body 11 and a predetermined delay-time difference between the signal lines. Therefore, it is possible to reduce the delay-time difference between the signal lines as well as to prevent impedance mismatching without decreasing the board-cutting efficiency.

It is possible to reduce the delay-time difference between signal lines without decreasing the board-cutting efficiency.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A printed board comprising:
    an insulating body that has a flat surface and includes insulating cloth including first fibers and second fibers that cross the first fibers at right angles on the flat surface; and
    printed wiring including a pair of signal lines that is connected to predetermined circuits, wherein a direction of the signal lines is tilted with respect to a direction of the first or second fibers at a predetermined angle, and
    wherein the pair of signal lines is laid out on the flat surface of the insulating body.

2. The printed board according to claim 1, wherein the predetermined angle is 9 degrees.

3. The printed board according to claim 1, wherein the predetermined angle is determined based on board-cutting efficiency of the insulating body and a predetermined delay-time difference between the signal lines, wherein the predetermined delay-time difference is 20 picoseconds.

4. A method of manufacturing a printed board, the method comprising:
    forming a flat surface on an insulating body including insulating cloth which includes first fibers and second fibers, so that the second fibers cross the first fibers at right angles on the flat surface; and
    disposing printed wiring including a pair of signal lines connected to predetermined circuits, wherein a direction of the signal lines on the flat surface is tilted with respect to a direction of the first or second fibers at a predetermined angle; and
    wherein the pair of signal lines is laid out on the flat surface of the insulating body.

5. The method of manufacturing the printed board according to claim 4, wherein the predetermined angle is 9 degrees.

6. The method of manufacturing the printed board according to claim 4, wherein the predetermined angle is determined based on board-cutting efficiency of the insulating body and a predetermined delay-time difference between the signal lines, wherein the predetermined delay-time difference is 20 picoseconds.

* * * * *